United States Patent [19]

Kashiwagi

[11] Patent Number: 5,434,757
[45] Date of Patent: Jul. 18, 1995

[54] UNIT PANEL STRUCTURE FOR A DOOR TRIM

[75] Inventor: Naoki Kashiwagi, Kanagawa, Japan

[73] Assignee: Kasai Kogyo Co., Ltd., Tokyo, Japan

[21] Appl. No.: 112

[22] Filed: Jan. 4, 1993

[30] Foreign Application Priority Data

Apr. 1, 1992 [JP] Japan .................. 4-079957

[51] Int. Cl.⁶ .............................. B60Q 1/26
[52] U.S. Cl. ........................ 362/80; 362/23;
362/29; 362/85; 362/276; 362/802; 315/77;
315/360; 200/314; 200/317
[58] Field of Search ............ 307/10.8; 315/77, 84,
315/360, 362; 362/23, 28, 29, 75, 83.3, 85, 95,
100, 131, 802, 276, 80; 200/314, 315, 317

[56] References Cited

U.S. PATENT DOCUMENTS

| | | | |
|---|---|---|---|
| 893,214 | 7/1908 | Williams et al. | 362/100 |
| 3,162,374 | 12/1964 | Skokut | 362/100 |
| 4,234,909 | 11/1980 | Cotroneo | 362/100 |
| 4,293,894 | 10/1981 | Blank | 362/100 |
| 4,310,873 | 1/1982 | Bean | 362/100 |
| 4,334,134 | 6/1982 | Janda | 200/314 |
| 4,532,395 | 7/1985 | Zukowski | 200/317 |
| 4,739,224 | 4/1988 | Geerlings | 315/84 |
| 4,811,175 | 3/1989 | DeSmet | 362/95 |
| 5,057,975 | 10/1991 | Evigan | 362/100 |
| 5,149,187 | 9/1992 | Matsuno et al. | 362/75 |
| 5,174,643 | 12/1992 | Priesemuth | 362/802 |
| 5,179,325 | 1/1993 | Aragon, Jr. | 362/100 |
| 5,205,637 | 4/1993 | Caspari | 362/23 |

FOREIGN PATENT DOCUMENTS 935833 11/1955 Germany .
3635644 4/1987 Germany .

*Primary Examiner*—Ira S. Lazarus
*Assistant Examiner*—Alan B. Cariaso
*Attorney, Agent, or Firm*—Dickstein, Shapiro & Morin

[57] ABSTRACT

To allow smooth access to such elements as operating knobs for power window switches and a door lock switch provided in a unit panel in the night time lighting condition, the entire surface of an escutcheon panel mounted on the unit panel is defined as a switch operating part for an illuminating lamp which illuminates the elements to be accessed. The illuminating lamp may be lighted up for a prescribed time period to illuminate the escutcheon panel when the switch operating part is touched so that unnecessary consumption of electric power may be avoided. The escutcheon panel may be made of at lease semi-transparent plastic so that light from an illuminating lamp placed behind the escutcheon panel may be transmitted through the escutcheon panel. Alternatively, the element to be accessed such as a switch knob mounted on the escutcheon panel may be made of at lease semi-transparent plastic so that illuminating light may be transmitted therethrough.

22 Claims, 6 Drawing Sheets

UNIT PANEL STRUCTURE FOR A DOOR TRIM

TECHNICAL FIELD

The present invention relates to the structure of a unit panel carrying elements that need to be accessed by a vehicle occupant and mounted on a vehicle door trim, typically but nonexclusively as a part of an arm rest, and in particular to such a panel unit for a door trim which is convenient at night particularly when it is used on a vehicle such as an automobile.

BACKGROUND OF THE INVENTION

As illustrated in FIG. 12 as an example, a unit panel 3 is typically mounted on the upper surface of an arm rest 2 of a door trim 1, and the unit panel 3 contains therein operating knobs 4 for operating power window switches which open and close corresponding window glass sheets, and an operating knob 5 for a door lock switch.

To operate a power window or activate a door lock at night, one has to grope for such knobs because the passenger compartment is dark at such a time. Therefore, it has been proposed to provide an illuminating system in which an opening 6 is provided in each of the operating knobs 4 and 5 so that the area surrounding the operating knobs 4 and 5 may be illuminated by the light from an internally positioning lamp 7 passed through the opening 6.

However, with only the light from the positioning lamp 7, it is difficult to distinguish the operating knobs from one another, and it has been desired to improve the convenience in the operation of power window switches and door lock switches.

Further, the unit panel 3 is typically provided with an ash tray, and it has been pointed out that an occupant may spill cigarette ash when he tries to reach for the ash tray in the dark, and litter the passenger compartment.

BRIEF SUMMARY OF THE INVENTION

In view of such problems of the prior art, a primary object of the present invention is to provide a unit panel structure for a door trim which can be favorably illuminated to aid the user in the dark when he tries to reach for one of a plurality of elements mounted on the unit panel.

A second object of the present invention is to provide a unit panel structure for a door trim which can be favorably illuminated but economical to manufacture.

A third object of the present invention is to provide a unit panel structure for a door trim which can be readily illuminated when necessary.

A fourth object of the present invention is to provide a unit panel structure for a door trim which can be readily illuminated when necessary but is provided with means for preventing unnecessary power consumption.

These and other objects of the present invention can be accomplished by providing a unit panel for a door trim, comprising: an escutcheon panel provided in a door trim for mounting an element that is to be accessed by a user; an illuminating lamp for illuminating the element; and an electric circuit including an electric switch for selectively lighting up the illuminating lamp, a substantially entire surface of the escutcheon panel being defined as an operating part for activating the switch.

By thus defining the entire surface of the escutcheon panel as a switch operating part of the illuminating lamp, it is possible to light up the illuminating lamp, preferably for a prescribed time period, simply by touching or pressing an arbitrary part of the surface of the escutcheon panel preferably only when the vehicle lighting system is turned on or when the ignition switch is turned on. If the illuminating lamp is automatically turned off after being lighted up for a prescribed time period, unnecessary power consumption can be avoided. Further, if the illuminating lamp is connected to a circuit for a vehicle lighting system, it is possible to avoid the inadvertent activation of the illuminating device in day time.

Thus, particularly when the vehicle lighting system is turned on, because the escutcheon panel can be illuminated for a prescribed time period simply by touching an arbitrary part of the escutcheon panel, it becomes possible to smoothly operate the power window switches and the door lock switch even in the dark.

The switch may consist of a pressure sensor, a contact sensor or a mechanical contact switch using the escutcheon panel as its operating part. The element to be accessed may consist of a knob of an electric switch unit, an ash tray, an inside door handle or any member which may need to be accessed in the dark.

According to a preferred embodiment, the element to be accessed such as a knob of an electric switch is made of at least semi-transparent material, and the illuminating lamp is placed behind the element to be accessed for transmitting light therefrom therethrough. Alternatively, the escutcheon panel may be made of at least semi-transparent material, and the illuminating lamp may be placed behind the escutcheon panel for transmitting light therefrom through the escutcheon panel.

If desired, the illuminating lamp may be provided adjacent and externally of the escutcheon panel, and even may consist of a room lamp.

BRIEF DESCRIPTION OF THE DRAWINGS

Now the present invention is described in the following in terms of preferred embodiments with reference to the appended drawings, in which.

DETAILED DESCRIPTION OF THE PREFERRED EMBODIMENTS

Figure 1:
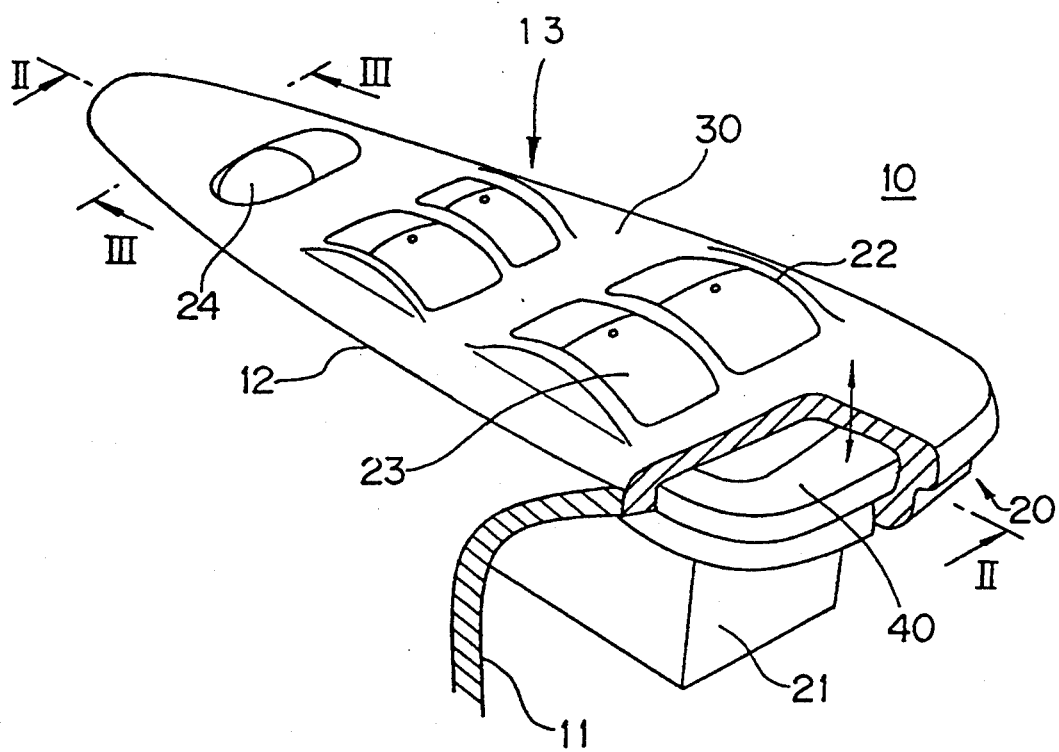
FIG. 1 is a perspective view showing the overall structure of a first embodiment of the unit panel according to the present invention.

FIGS. 1 through 8 show a first embodiment of the present invention. Referring to FIG. 1, a unit panel 13 according to the present invention is fitted into an opening 12 formed in an upper surface of an arm rest 11 of a door trim 10, and this unit panel 13 comprises an escutcheon panel 20 covering a switch unit 21 including power window switch mechanisms, and a door lock switch mechanism, four operating knobs 23 for power window switches exposed to the passenger compartment through corresponding openings 22 provided in the escutcheon panel 20, and a similar operating knob 24 for a door lock switch.

Now, a primary feature of the present invention is that the entire front surface of the escutcheon panel 20 serves as an operating part of the illuminating device.

Figure 2:
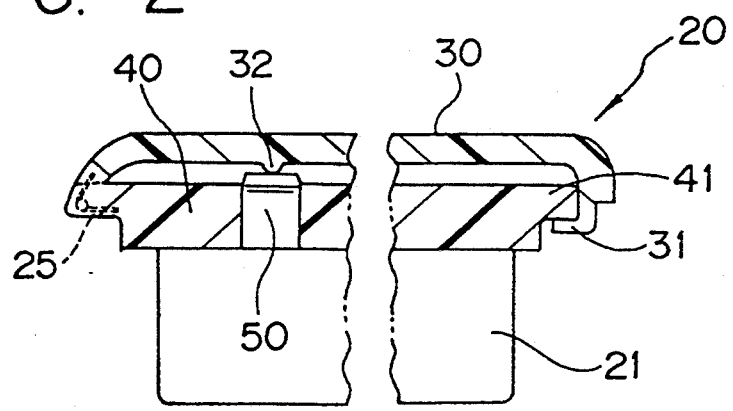
FIG. 2 is a sectional view taken along line II—II of FIG. 1.
Figure 3:
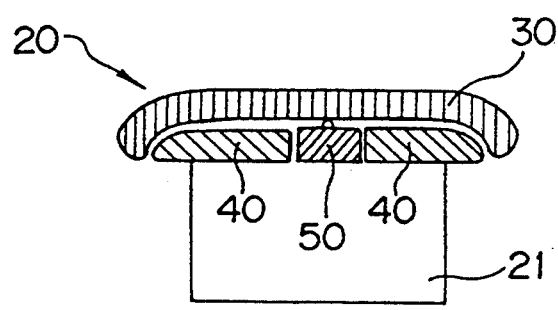
FIG. 3 is a sectional view taken along line III—III of FIG. 1.

More specifically, according to this embodiment, the escutcheon panel 20 is double-walled, and includes a front escutcheon panel 30 and a rear escutcheon panel 40. As illustrated in FIGS. 2 and 3, the rear escutcheon panel 40 is securely fixed to the upper surface of the switch unit 21, and the front escutcheon panel 30 is spaced above the rear escutcheon panel 40. Further, the front edge of the front escutcheon panel 30 is connected to the front end of the rear escutcheon panel 40, and the front escutcheon panel 30 is biased by a sheet spring 25 so that the rear end of the front escutcheon panel 30 is urged away from the rear escutchoen panel 40. At the rear end of the escutcheon panel 20, a pawl 31 integrally formed with the front escutcheon panel 30 is engaged with a flange 41 provided in the rear escutcheon panel 40 so as to define a certain clearance therebetween.

Therefore, the front escutcheon panel 30 can move toward and away from the rear escutcheon panel 40 with a small clearance defined therebetween so that, when an arbitrary point of the front escutchoen panel 30 is 10 touched, the front escutchoen panel 30 deflects downward, and the clearance between the two escutchoen panels 30 and 40 changes. A pressure sensor 50 is provided for the purpose of detecting the change in the small clearance between the front escutchoen panel 30 and the rear escutchoen panel 40.

Figure 4:
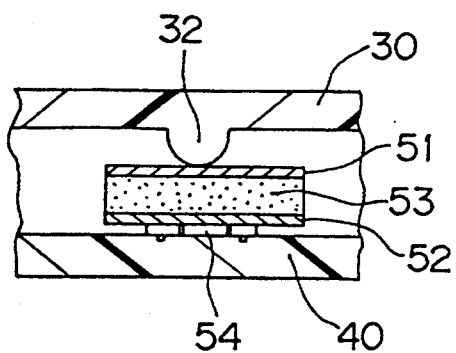
FIG. 4 is a sectional view showing the structure of a first embodiment of the pressure switch used in the present invention.
Figure 5:
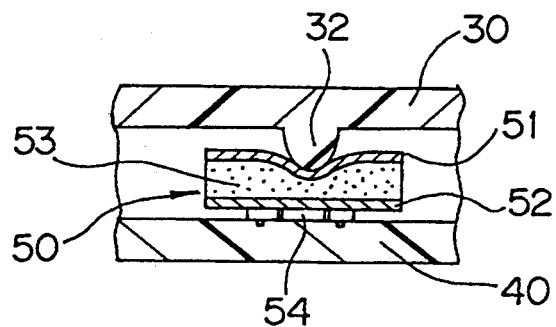
FIG. 5 is a sectional view showing the activated condition of the pressure switch shown in FIG. 4.

First of all, the pressure sensor 50, as illustrated in FIG. 4, may consist of a flexible sensor array made of pressure-sensitive electroconductive rubber in which a layer of pressure-sensitive electroconductive rubber 53 is interposed between a pair of electrodes 51 and 52, and the pressure sensor 50 is securely fixed to the upper surface of the rear escutchoen panel 40.

The lower surface of the front escutcheon panel 30 is integrally provided with a projection 32 in such a manner that when the front escutcheon panel 30 is pressed downward the projection 32 provided in the front escutcheon panel 30 compresses the pressure-sensitive electroconductive rubber 53, and the electric resistance between the two electrodes 51 and 52 changes. This in turn activates an active circuit 54.

Alternatively, it is possible to use a normal pressure sensor using a high polymer piezoelectric material or an electrostatic capacitance type pressure sensor. Since a piezoelectric or electrostatic capacitive pressure sensor can accurately detect a light pressure applied thereto, a light touch on the front surface of the front escutcheon panel 30 causes the pressure sensor 50 to be activated, and the illumination device may be activated as described hereinafter.

A recently developed touch sensor can activate a circuit simply by touching it with a human hand. More specifically, a human body carries a voltage induced by the AC 100 volts, and this voltage can activate an RS flip-flop by being applied to a CMOS FET having a large input resistance.

By making use of this principle, it suffices if an electrode consisting of a pattern in a printed circuit board forming a touch sensor is provided on the surface of the escutcheon panel 20, and this touch sensor can eliminate the need for the double-wall structure of the escutcheon panel 20.

As a yet another alternative, it is possible to use a pressure sensor 60 of a mechanical contact type which can be activated by the operation of the switch operating part provided on the escutcheon panel 20.

Figure 6:
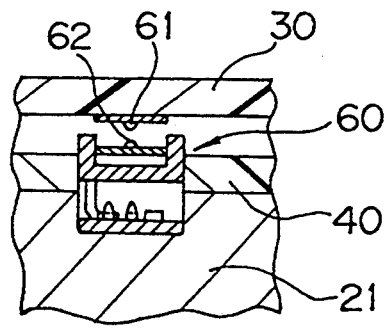
FIG. 6 is a sectional view showing the structure of another embodiment of the pressure switch used in the present invention.
Figure 7:
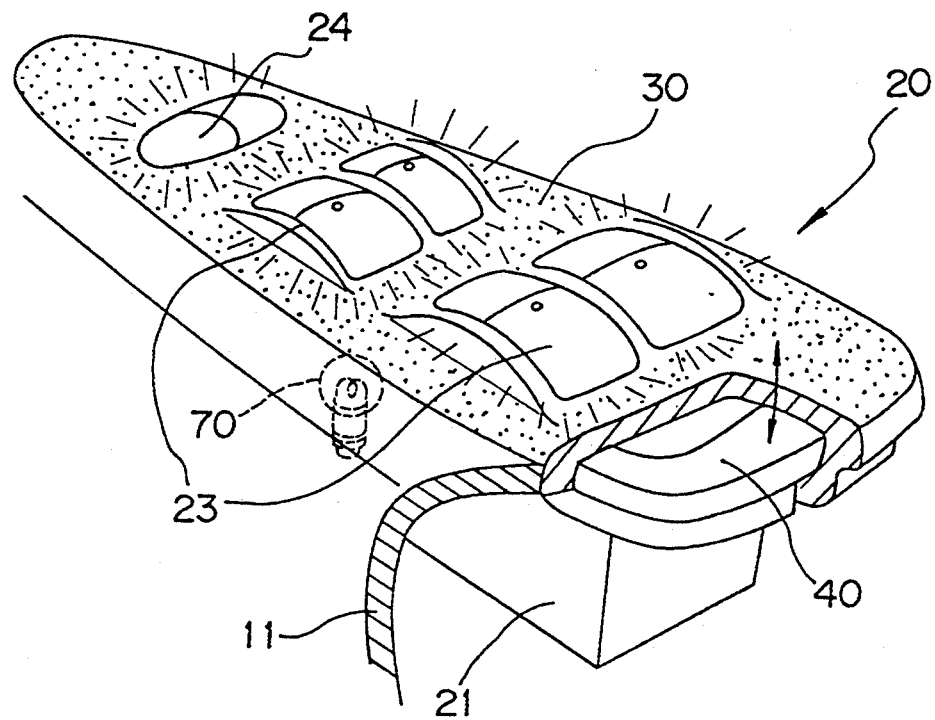
FIG. 7 is an explanatory view showing the illuminating lamp in the unit panel according to the present invention in its lighted up condition.

In this case, as illustrated in FIG. 6, a moveable contact 61 is fixedly secured to the front escutcheon panel 30, and a corresponding fixed contact 62 is fixedly secured to the rear escutcheon panel 40 so that a circuit may be activated by pressing down the front escutcheon panel 30 and contacting the two contacts 61 and 62 with each other.

When this contact type switch 60 is used, since the contact type switch 60 would not be turned on when the escutcheon panel 20 is simply touched, and the front escutcheon panel 30 needs to be deliberately pushed down by more than a prescribed pressure for the contact type switch 60 to be turned on, an inadvertent operation of the illuminating device for the escutcheon panel 20 can be effectively avoided.

According to these embodiments, when the lighting system of the vehicle is activated, turning on of the pressure switch 50 or 60 causes an illumination lamp 70 incorporated in the switch unit 21 to be lighted up for a prescribed time period (15 seconds, for instance), and it is turned off automatically thereafter.

In these embodiments, since the front escutcheon panel 30 and the rear escutcheon panel 40 making up the escutcheon panel 20 are made of opaque plastic plate, 10 and the operating knobs 23 and 24 are made of transparent or semi-transparent plastic, the illuminating lamp 70 can illuminate the escutcheon panel 20 in general through the operating knobs 23 and 24.

Therefore, when the front surface of the escutcheon panel 20 is touched or pressed in the night time lighted condition, the operation of the pressure sensor 50 or the pressure switch 60 causes the illuminating lamp 70 to be lighted up for a prescribed time period and the surrounding part of the escutcheon panel 20 is illuminated so that the operating knobs 23 and 24 for the power window switches and the door lock switch can be easily operated even in the dark, and the convenience of the switch unit can be significantly improved.

Figure 8:
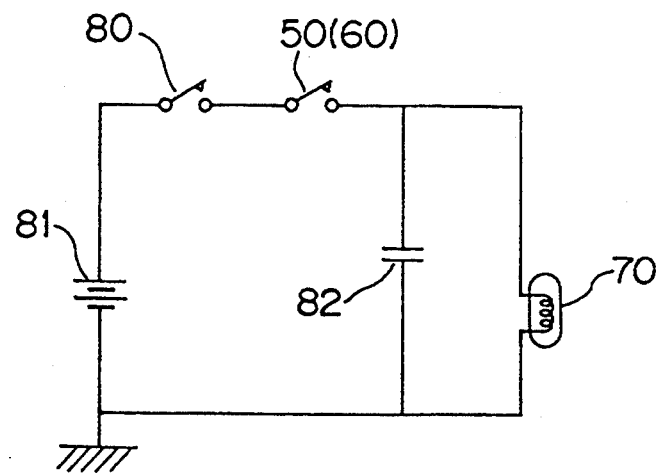
FIG. 8 is a circuit diagram showing the circuit structure of the illuminating device used in the unit panel according to the present invention.

FIG. 8 shows a circuit diagram of an electric circuit for the above described embodiments. Referring to this circuit diagram, in the night time lighted condition, when the ignition switch 80 is turned on, by activating the pressure sensor 50 or the pressure switch 60, electric current supplied from an on-board battery 81 is supplied to the illuminating lamp 70 to light it up, and a capacitor 82 connected in parallel with the illuminating lamp 70 is electrically charged at the same time. When the pressure sensor 50 or the pressure switch 60 is de-activated, electric current continues to be supplied to the illuminating lamp 70, however, from the capacitor 82 in this case. When the capacitor 82 is fully discharged, the illuminating lamp 70 is automatically turned off.

Therefore, when the ignition switch 80 is turned off or in the day time condition, even when the escutcheon panel 20 is touched or pressed, the illuminating lamp 70 would not be lighted up, and an economic advantage can be obtained with the consumption of electric power minimized, combined with the fact that the illuminating lamp 70 is automatically turned off after a prescribed time period even when it is lighted up in the night time lighting condition.

Figure 9:
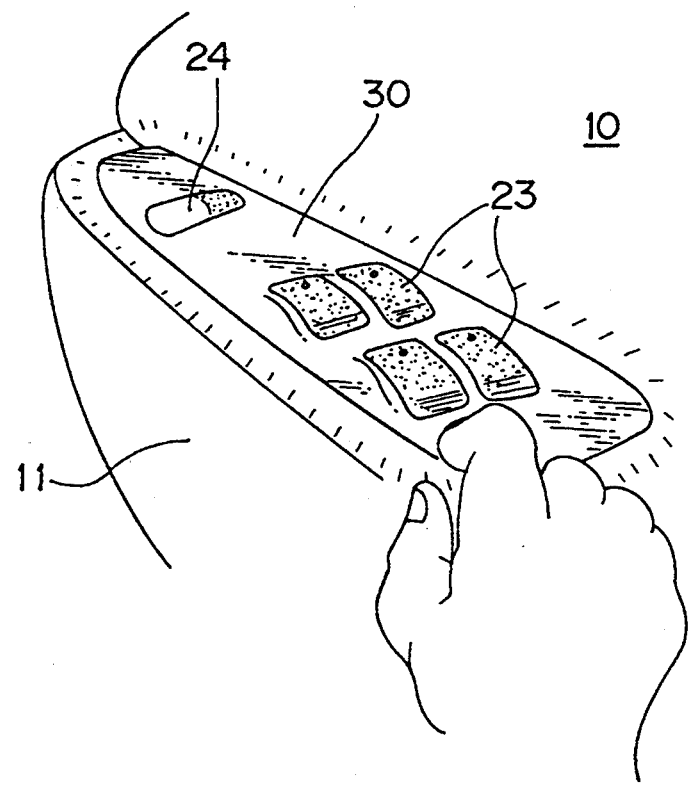
FIG. 9 is an explanatory view showing a second embodiment of the unit panel according to the present invention with its illuminating device in its operative condition.
Figure 10:
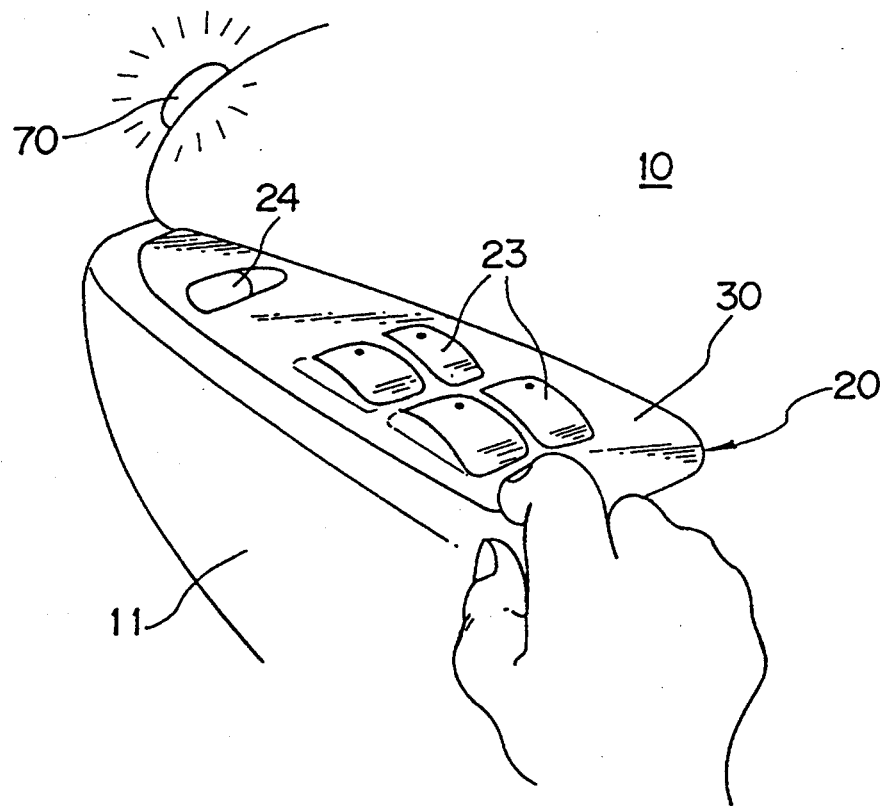
FIG. 10 is a perspective view showing yet another embodiment of the unit panel for a door trim according to the present invention with its illuminating device in its operative condition.
Figure 11:
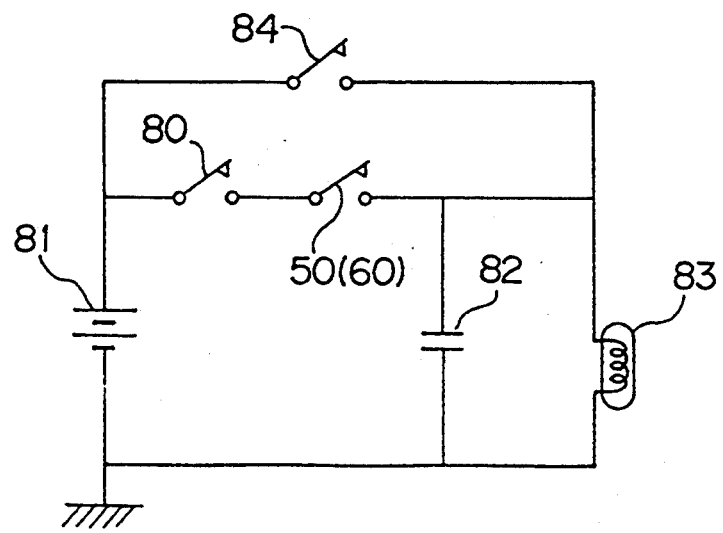
FIG. 11 is a circuit diagram showing the circuit structure of yet another embodiment of the unit panel for a door trim according to the present invention in which a room lamp is used as the illuminating device.
Figure 12:
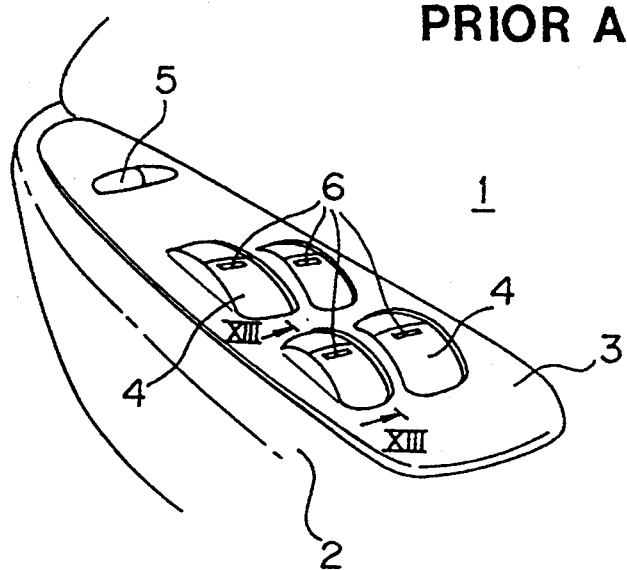
FIG. 12 is a perspective view showing a conventional unit panel for a door trim.
Figure 13:
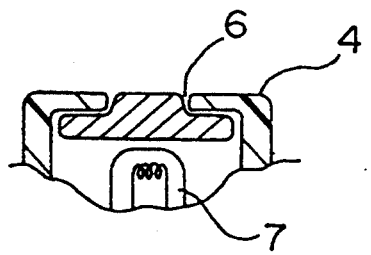
FIG. 13 is a sectional view taken along line XIII—XIII of FIG. 12.

FIGS. 9 through 11 show another embodiment of the present invention. FIGS. 9 and 10 are perspective views of embodiments featuring two different modes of illumination, and FIG. 11 is a circuit diagram featuring yet another mode of illumination. In FIG. 9, the parts corresponding to those of the previous embodiments are denoted with like numerals.

A primary feature of the embodiment illustrated in FIG. 9 is that the region illuminated by the illuminating lamp 70 incorporated in the switch unit 21 is the entire escutcheon panel 30. Therefore, the material for the front escutcheon panel 30 and the rear escutcheon panel 40 consists of transparent or semi-transparent plastic which allows transmission of light therethrough.

More specifically, as shown in FIG. 9, in the night time lighting condition, when the escutcheon panel 20 is touched or pressed, and the pressure sensor 50 or the pressure switch 60 is turned on in the same manner as in the previous embodiments, the illuminating lamp 70 is lighted up for a prescribed time period, and the entire escutcheon panel 20 is illuminated by the light transmitting through the rear escutcheon panel 40 and the front escutcheon panel 30 so that the operation of the operating knobs 23 and 24 for power window switches and a door lock switch may be facilitated.

As shown in FIG. 10, the illuminating lamp 70 may be placed near the escutcheon panel 20 instead of in the switch unit 21. In this case, since the front escutcheon panel 30, the rear escutcheon panel 40 and the operating knobs 23 and 24 can be all made of opaque plastic for general purpose, manufacturing cost can be reduced.

As an alternate embodiment of the present invention, it is also possible to use a room lamp as the illuminating device for illuminating the escutcheon panel 20. An electric circuit for this embodiment is described with reference to FIG. 11. A room lamp 83 is turned on and off by the closing and opening of a switch 84 for the room lamp. When an ignition switch 80 and a pressure sensor 50 (or a pressure switch 60) connected in parallel with the switch 84 are both on, a capacitor 82 is charged, and the room lamp 83 is lighted up for a prescribed time period by the discharge of the capacitor 82 before the lamp is automatically turned off.

Therefore, in the night time lighting condition, when the escutcheon panel 20 is touched or pressed, the room lamp 83 is lighted up for a prescribed time period so that the operation of the power window switches and the door lock switch can be facilitated in the same beneficial way as in the previous embodiments.

This embodiment is beneficial not only for facilitating the operation of the operating knobs 23 and 24 for power window switches and a door lock switch but also for aiding the recognition of the locations of an inside door handle, an ash tray and other parts provided on or near the door trim.

The advantages of the present invention may be summarized as given in the following.

(1) According to the present invention, in the night time lighting condition, since the illuminating lamp lights up for a prescribed time period and illuminates the escutcheon panel simply by touching the front escutcheon panel, the user can readily recognize the location of the operating knobs for power window switches and a door lock switch.

(2) According to the present invention, in the night time lighting condition, since the illuminating lamp is lighted up for a prescribed time period simply by touching the escutcheon panel, it can be used not only for the convenience of switch operation but also for allowing the recognition of the locations of an ash tray and a door handle.

(3) According to the present invention, since the illuminating device is lighted up only for prescribed time period before it is automatically turned off, unnecessary consuption of electric power can be avoided. Further, the illuminating device may be connected to the lighting system of the vehicle so that inadvertent activation of the illuminating device may be avoided in the day time. These factor contribute to the minimization of power consumption, and an economic advantage can be obtained.

Although the present invention has been described in terms of specific embodiments, it is possible to modify and alter details thereof without departing from the spirit of the present invention.

What I claim is:

1. A unit panel for an automobile door trim, comprising:
   an escutcheon panel displaceably mounted on said automobile door trim with an element mounted on said escutcheon panel that is to be accessed by a user;
   an illuminating lamp for illuminating the element; and
   an electric circuit including an electric switch for selectively activating said illuminating lamp, a substantially entire surface of said escutcheon panel being displaceable to thereby activate said switch.

2. A unit panel for an automobile door trim according to claim 1, wherein said circuit comprises a timer circuit for maintaining said illuminating lamp activated for a prescribed time period.

3. A unit panel for an automobile door trim according to claim 1, wherein said electric switch comprises a pressure sensor which is activated upon displacement of said escutcheon panel.

4. A unit panel for an automobile door trim according to claim 1, wherein said electric switch comprises a touch sensor which is activated upon displacement of said escutcheon panel.

5. A unit panel for an automobile door trim according to claim 1, wherein said electric switch comprises a mechanical contact switch which is activated upon displacement of said escutcheon panel.

6. A unit panel for an automobile door trim, comprising:

an escutcheon panel displaceably mounted on said automobile door trim with an element mounted on said escutcheon panel that is to be accessed by a user;

an illuminating lamp for illuminating the element; and an electric circuit including an electric switch for selectively activating said illuminating lamp, a substantially entire surface of said escutcheon panel being displaceable to thereby activate said switch;

said element comprising a knob of a switch unit exposed to a passenger compartment through an opening provided in said escutcheon panel, said knob being at least semi-transparent, and said illuminating lamp being placed behind said knob for transmitting light therefrom through said knob.

7. A unit panel for an automobile door trim, comprising:

an escutcheon panel displaceably mounted on said automobile door trim with an element mounted on said escutcheon panel that is to be accessed by a user;

an illuminating lamp for illuminating the element; and an electric circuit including an electric switch for selectively activating said illuminating lamp, a substantially entire surface of said escutcheon panel being displaceable to thereby activate said switch;

said escutcheon panel being at least semi-transparent material, and said illuminating lamp being placed behind said escutcheon panel for transmitting light therefrom through said escutcheon panel.

8. A unit panel for an automobile door trim, comprising:

an escutcheon panel displaceably mounted on said automobile door trim with an element mounted on said escutcheon panel that is to be accessed by a user;

an illuminating lamp for illuminating the element; and an electric circuit including an electric switch for selectively activating said illuminating lamp, a substantially entire surface of said escutcheon panel being displaceable to thereby activate said switch;

said illuminating lamp being provided adjacent to and externally of said escutcheon panel.

9. A unit panel for an automobile door trim according to claim 1, wherein wherein said illuminating lamp consists of a room lamp.

10. A unit panel for an automobile door trim according to claim 1, wherein said door trim consists of an arm rest provided in an automotive door trim.

11. A unit panel for incorporation in an automobile door trim, comprising:

an escutcheon panel mounted on said automobile door trim, said escutcheon panel surrounding a surface of a switch unit;

an operating knob of said switch unit exposed to a passenger compartment through an opening provided in said escutcheon panel;

wherein an entire surface of said escutcheon panel is defined as a switch operation unit for operating an illumination unit, said illumination unit illuminating said escutcheon panel for a prescribed time period upon touching operation of said switch operation unit.

12. A unit panel according to claim 11, further comprising a piezo-electric pressure sensor which activates said illumination unit in response to operation of said switch operation unit.

13. A unit panel according to claim 11, further comprising a touch sensor which activates said illumination unit in response to operation of said switch operation unit.

14. A unit panel according to claim 11, further comprising a contact switch which activates said illumination unit in response to operation of said switch operation unit.

15. A unit panel for an automobile door trim, comprising:

an escutcheon panel mounted on said automobile door trim, said escutcheon panel surrounding a surface of a switch unit;

an operating knob of said switch unit exposed to a passenger compartment through an opening provided in said escutcheon panel;

wherein an entire surface of said escutcheon panel is defined as a switch operation unit for operating an illumination unit which illuminates said escutcheon panel for a prescribed time period upon touching operation of said switch operation unit;

said illumination unit being incorporated in said switch unit, and said operating knob being at least partially translucent such that said escutcheon panel is illuminated by light transmitted through said operating knob.

16. A unit panel for an automobile door trim, comprising:

an escutcheon panel mounted on said automobile door trim, said escutcheon panel surrounding a surface of a switch unit;

an operating knob of said switch unit exposed to a passenger compartment through an opening provided in said escutcheon panel;

wherein an entire surface of said escutcheon panel is defined as a switch operation unit for operating an illumination unit which illuminates said escutcheon panel for a prescribed time period upon touching operation of said switch operation unit;

said illuminating unit being incorporated in said switch unit, and said escutcheon panel being at least partially translucent such that said escutcheon panel is illuminated by light transmitted through said escutcheon panel.

17. A unit panel for an automobile door trim, comprising:

an escutcheon panel mounted on said automobile door trim, said escutcheon panel surrounding a surface of a switch unit;

an operating knob of said switch unit exposed to a passenger compartment through an opening provided in said escutcheon panel;

wherein an entire surface of said escutcheon panel is defined as a switch operation unit for operating an illumination unit which illuminates said escutcheon panel for a prescribed time period upon touching operation of said switch operation unit;

said illuminating unit being adjacent to said escutcheon panel.

18. A unit panel for an automobile door trim according to claim 11, wherein the illuminating unit comprises of a room lamp.

19. A unit panel for an automobile door trim according to claim 6, wherein said circuit comprises a timer circuit for maintaining said illuminating lamp activated for a prescribed time period.

20. A unit panel for an automobile door trim according to claim 6, wherein said electric switch comprises a pressure sensor which is activated upon displacement of said escutcheon panel.

21. A unit panel for an automobile door trim according to claim 6, wherein said electric switch comprises a touch sensor which is activated upon displacement of said escutcheon panel.

22. A unit panel for an automobile door trim according to claim 6, wherein said electric switch comprises a mechanical contact switch which is activated upon displacement of said escutcheon panel.

* * * * *